US011404486B2

(12) United States Patent
Wang et al.

(10) Patent No.: US 11,404,486 B2
(45) Date of Patent: Aug. 2, 2022

(54) DISPLAY SUBSTRATE, MANUFACTURING METHOD THEREOF AND DISPLAY DEVICE

(71) Applicant: BOE Technology Group Co., Ltd., Beijing (CN)

(72) Inventors: Can Wang, Beijing (CN); Can Zhang, Beijing (CN); Xiaochuan Chen, Beijing (CN); Minghua Xuan, Beijing (CN); Han Yue, Beijing (CN); Ming Yang, Beijing (CN); Ning Cong, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 297 days.

(21) Appl. No.: 16/604,768

(22) PCT Filed: Apr. 4, 2019

(86) PCT No.: PCT/CN2019/081463
§ 371 (c)(1),
(2) Date: Oct. 11, 2019

(87) PCT Pub. No.: WO2019/214378
PCT Pub. Date: Nov. 14, 2019

(65) Prior Publication Data
US 2021/0327966 A1    Oct. 21, 2021

(30) Foreign Application Priority Data
May 9, 2018    (CN) .......................... 201810438219.8

(51) Int. Cl.
*H01L 27/32*    (2006.01)
*H01L 51/50*    (2006.01)
(Continued)

(52) U.S. Cl.
CPC ...... *H01L 27/3206* (2013.01); *H01L 51/5044* (2013.01); *H01L 51/5218* (2013.01);
(Continued)

(58) Field of Classification Search
CPC .............. H01L 27/3206; H01L 27/322; H01L 51/5265; H01L 2251/558
See application file for complete search history.

(56) References Cited

U.S. PATENT DOCUMENTS 9,231,034 B1    1/2016  Chen et al.
9,825,245 B2 *  11/2017 Kam .................. H01L 27/3209
(Continued)

FOREIGN PATENT DOCUMENTS

CN    102024844 A    4/2011
CN    103050630 A    4/2013
(Continued)

OTHER PUBLICATIONS

"First Office Action and English language translation", CN Application No. 201810438219.8, dated Mar. 23, 2021, 19 pp.
(Continued)

*Primary Examiner* — Kyoung Lee
*Assistant Examiner* — Christina A Sylvia
(74) *Attorney, Agent, or Firm* — Myers Bigel, P.A.

(57) ABSTRACT

The present application relates to a display substrate, a manufacturing method thereof, and a display device. The display substrate includes a base plate, a plurality of pixel structures on the base plate, and a color resist layer on a side of the plurality of pixel structures away from the base plate. The color resist layer includes a plurality of color resist blocks, each color resist block corresponding to one or more of the plurality of pixel structures. Light emitted from each of the plurality of pixel structures has the same color as the color resist block corresponding thereto.

13 Claims, 11 Drawing Sheets

(51) Int. Cl.
*H01L 51/52* (2006.01)
*H01L 51/56* (2006.01)

(52) U.S. Cl.
CPC .......... *H01L 51/5265* (2013.01); *H01L 51/56* (2013.01); *H01L 27/322* (2013.01); *H01L 2251/558* (2013.01)

(56) References Cited

U.S. PATENT DOCUMENTS

| | | | |
|---|---|---|---|
| 10,998,532 B2* | 5/2021 | Li | H01L 27/326 |
| 2009/0079333 A1 | 3/2009 | Koo | |
| 2011/0062475 A1 | 3/2011 | Cho | |
| 2012/0206675 A1 | 8/2012 | Seo et al. | |
| 2013/0140533 A1 | 6/2013 | Lee et al. | |
| 2014/0117842 A1 | 5/2014 | Hanamura | |
| 2014/0209870 A1 | 7/2014 | Shim et al. | |
| 2014/0225102 A1 | 8/2014 | Ikeda et al. | |
| 2016/0254323 A1 | 9/2016 | Wang et al. | |
| 2017/0256743 A1* | 9/2017 | Uesaka | H01L 51/5044 |
| 2017/0309859 A1 | 10/2017 | Lee et al. | |
| 2018/0061911 A1 | 3/2018 | Sun et al. | |

FOREIGN PATENT DOCUMENTS

| | | |
|---|---|---|
| CN | 103985732 A | 8/2014 |
| CN | 104103672 A | 10/2014 |
| CN | 104218169 A | 12/2014 |
| CN | 105514295 A | 4/2016 |
| CN | 106410049 A | 2/2017 |
| CN | 107204400 A | 9/2017 |
| EP | 2296203 A2 | 3/2011 |
| EP | 3236506 A1 | 10/2017 |

OTHER PUBLICATIONS

"Communication with Supplementary European Search Report", EP Application No. 19800317.0, dated Jan. 25, 2022, 10 pp.

* cited by examiner ical Field

The present application relates to the field of display technologies, and in particular to a display substrate, a manufacturing method thereof and a display device.

BACKGROUND ART

With the development of display technologies, Organic Light-Emitting Diode (OLED) display substrates have been widely used.

An OLED display substrate usually comprises a base plate and a plurality of OLEDs arranged on the base plate. Besides, a color resist layer is further disposed on a side of the plurality of OLEDs away from the base plate. Exemplarily, such OLEDs can all emit white light. The color resist layer comprises a plurality of color resist blocks corresponding to the plurality of OLEDs respectively. Specifically, the plurality of color resist blocks comprise red color resist blocks, green color resist blocks and blue color resist blocks. Each color resist block only allows transmission of light having a designated wavelength among the incident white light. For example, the red color resist block only allows transmission of red light, the green color resist block only allows transmission of green light, and the blue color resist block only allows transmission of blue light, such that the OLED display substrate emits colored light.

However, in related arts, the colored light emitted from the OLED display substrate has a lower color purity, which results in a poor display effect of the OLED display substrate.

SUMMARY

According to an aspect of the present disclosure, a display substrate is provided. The display substrate comprises: a base plate, a plurality of pixel structures on the base plate, and a color resist layer on a side of the plurality of pixel structures away from the base plate, wherein the color resist layer comprises a plurality of color resist blocks, each color resist block corresponding to one or more of the plurality of pixel structures, and light emitted from each of the plurality of pixel structures has the same color as the color resist block corresponding thereto.

Optionally, each pixel structure comprises a plurality of electroluminescent structures connected in series.

Optionally, each pixel structure comprises a first light emitting layer, a second light emitting layer, a first electrical connection layer and a third light emitting layer arranged on the base plate sequentially. The plurality of electroluminescent structures comprises a first electroluminescent structure and a second electroluminescent structure. The first electroluminescent structure comprises the first light emitting layer and the second light emitting layer. The second electroluminescent structure comprises the third light emitting layer. The first electroluminescent structure and the second electroluminescent structure are connected in series via the first electrical connection layer. As an example, the first light emitting layer comprises a red light emitting layer, the second light emitting layer comprises a green light emitting layer, and the third light emitting layer comprises a blue light emitting layer.

Optionally, each pixel structure comprises a first light emitting layer, a second electrical connection layer, a second light emitting layer, a first electrical connection layer and a third light emitting layer arranged on the base plate sequentially. The plurality of electroluminescent structures comprises a first electroluminescent structure, a second electroluminescent structure and a third electroluminescent structure. The first electroluminescent structure comprises the first light emitting layer, the second electroluminescent structure comprises the second light emitting layer, and the third electroluminescent structure comprises the third light emitting layer. The first electroluminescent structure and the second electroluminescent structure are connected in series via the second electrical connection layer. The second electroluminescent structure and the third electroluminescent structure are connected in series via the first electrical connection layer.

Optionally, each color resist block corresponds to a respective pixel structure of the plurality of pixel structures.

Optionally, each pixel structure further comprises a first electrode and a second electrode, wherein the first electrode, the plurality of electroluminescent structures and the second electrode are arranged on the base plate sequentially. The first electrode comprises a reflective conducting layer, and the second electrode comprises a transflective conducting layer. A wavelength of light emitted from the pixel structure is positively correlated with a distance between the reflective conducting layer and the transflective conducting layer.

Optionally, the first electrode further comprises a first transparent conducting layer, an insulating layer and a second transparent conducting layer, wherein the first transparent conducting layer, the reflective conducting layer, the insulating layer and the second transparent conducting layer are arranged on the base plate sequentially. The second transparent conducting layer is electrically connected with the reflective conducting layer by means of a via hole in the insulating layer, and a wavelength of light emitted from the pixel structure is positively correlated with a thickness of the insulating layer in the first electrode.

Optionally, the first electrode further comprises a first transparent conducting layer and a second transparent conducting layer, wherein the first transparent conducting layer, the reflective conducting layer and the second transparent conducting layer are arranged on the base plate sequentially, and a wavelength of light emitted from the pixel structure is positively correlated with a thickness of the second transparent conducting layer in the first electrode.

Optionally, each pixel structure further comprises a functional film located between the first electrode and the second electrode, wherein the functional film comprises at least one of an electron injection layer, an electron transport layer, a hole injection layer and a hole transport layer, and a wavelength of light emitted from the pixel structure is positively correlated with a thickness of the functional film in the pixel structure.

Optionally, a distance d between the reflective conducting layer and the transflective conducting layer satisfies $$d = \frac{k\lambda}{2n\cos\theta},$$

wherein, k is a coefficient being positive integer, λ is a wavelength of light emitted from the pixel structure, n is an average refractive index of a medium between the reflective conducting layer and the transflective conducting layer, and θ is a reflective angle of light emitted from the pixel structure on the reflective conducting layer.

Optionally, the plurality of pixel structures comprises a first pixel structure for emitting a first color of light, a second pixel structure for emitting a second color of light, and a third pixel structure for emitting a third color of light. The coefficients k keeps the same in the first pixel structure, the second pixel structure and the third pixel structure.

Optionally, the plurality of pixel structures comprises a first pixel structure for emitting a first color of light, a second pixel structure for emitting a second color of light, and a third pixel structure for emitting a third color of light. The coefficients k keeps the same in the first pixel structure and the second pixel structure, but being smaller by one than the coefficient k in the third pixel structure.

According to another aspect of the present disclosure, a manufacturing method for a display substrate is provided. The method comprises steps of: providing a base plate; forming a plurality of pixel structures on the base plate; and forming a color resist layer on a side of the plurality of pixel structures away from the base plate. The color resist layer comprises a plurality of color resist blocks, each color resist block corresponding to one or more of the plurality of pixel structures, and light emitted from each of the plurality of pixel structures has the same color as the color resist block corresponding thereto.

Optionally, the step of forming a plurality of pixel structures on the base plate comprises: for each pixel structure, forming a first electroluminescent structure, a first electrical connection layer and a second electroluminescent structure sequentially on the base plate, wherein the first electroluminescent structure comprises a first light emitting layer and a second light emitting layer, the second electroluminescent structure comprises a third light emitting layer, and the first electroluminescent structure and the second electroluminescent structure are connected in series via the first electrical connection layer. As an example, the first light emitting layer comprises a red light emitting layer, the second light emitting layer comprises a green light emitting layer, and the third light emitting layer comprises a blue light emitting layer.

Optionally, the step of forming a plurality of pixel structures on the base plate comprises: for each pixel structure, forming a first electroluminescent structure, a second electrical connection layer, a second electroluminescent structure, a first electrical connection layer and a third electroluminescent structure sequentially on the base plate, wherein the first electroluminescent structure comprises a first light emitting layer, the second electroluminescent structure comprises a second light emitting layer, and the third electroluminescent structure comprises a third light emitting layer. Further, the first electroluminescent structure and the second electroluminescent structure are connected in series via the second electrical connection layer, and the second electroluminescent structure and the third electroluminescent structure are connected in series via the first electrical connection layer.

According to yet another aspect of the present disclosure, a display device is provided, wherein the display device comprises a display substrate as described in any of the above embodiments.

BRIEF DESCRIPTION OF DRAWINGS

In order to illustrate technical solutions in embodiments of the present disclosure more clearly, drawings to be used in depiction of the embodiments will be briefly introduced as follows. Apparently, the drawings in the depiction below only represent some embodiments of the present application. For a person having ordinary skills in the art, other embodiments can also be obtained from these drawings without any inventive efforts.

DETAILED DESCRIPTION OF EMBODIMENTS

To render the goals, technical solutions and advantages of the present application clearer, embodiments of the present application will be further described in detail with reference to the drawings.

Display devices boast advantages such as fast response speed, full curing and self-luminance, and thus have been widely used. For example, they can be applied in fields of flexible display, transparent display, micro-display and the like.

As an example, the application of display devices in the field of micro-display may comprise augmented reality (AR) display, helmet display, stereo display, glasses-type display and so on. In the field of micro-display, it is generally required that the display devices have higher color purity, brightness (e.g., above 1500 nit) and gamut. Embodiments of the present disclosure provide a display substrate and a display device comprising the display substrate. The display substrate can be applied not only to the field of micro-display, but also to other display fields. The present disclosure will not be limited in this regard.

Figure 1:
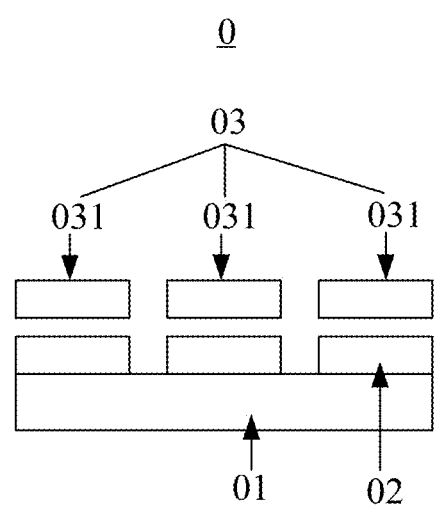
FIG. 1 is a schematic structure view of a display substrate according to an embodiment of the present disclosure.

FIG. 1 is a schematic structure view of a display substrate according to an embodiment of the present disclosure. As shown in FIG. 1, the display substrate 0 can comprise a base plate 01. Besides, a plurality of pixel structures 02 are further provided on the base plate 01, and a color resist layer 03 is further provided on a side of the plurality of pixel structures 02 away from the base plate 01. Specifically, the color resist layer 03 comprises a plurality of color resist blocks 031 corresponding to the plurality of pixel structures 02 respectively. Each of the plurality of pixel structures 02 emits light of a specific color. For each of the plurality of pixel structures 02, the color of light emitted from the pixel structure 02 is the same as the color of the color resist block 031 corresponding thereto.

It should be noted that each color resist block 031 corresponds to a color. This means that the color resist block 031 only allows light of a color corresponding thereto to pass through, and prohibits light of other colors not corresponding thereto to pass through. The color of color resist block 031 is namely the color of light corresponding to the color resist block.

To sum up, a display substrate is provided in embodiments of the present disclosure, comprising a plurality of pixel structures and a color resist layer, wherein each pixel structure is used for emitting light having the same color as the color resist block corresponding thereto. Therefore, among the light emitted from pixel structures, light capable of passing through the color resist blocks is in the majority, such that the display substrate is elevated in color purity and improved in display effect.

Optionally, the base plate may be made of silicon. Obviously, alternatively, the base plate may also be made of other materials, such as glass. Embodiments of the present disclosure shall not be limited in this regard.

Optionally, the pixel structure 02 in the display substrate 0 can also be a micro-cavity OLED. In other words, the pixel structure 02 can comprise a first electrode, a plurality of electroluminescent structures and a second electrode arranged on the base plate sequentially. In these two electrodes of the pixel structure 02, the first electrode (e.g., an anode) close to the base plate comprises a reflective conducting layer, and the second electrode (e.g., a cathode) away from the base plate comprises a transflective conducting layer. Thereby, the two electrodes can form a resonant cavity. The distance between the reflective conducting layer and the transflective conducting layer is namely the cavity length of the resonant cavity. According to the principle of resonance, the wavelength of light emitted from the pixel structure is positively correlated with the cavity length of the resonant cavity in the pixel structure. It should be noted that light emitted from all light emitting layers in the pixel structure 02 can be combined to form white light. In this case, the resonant cavity can pick light of a certain color in the white light so as to amplify the energy thereof, and accordingly weaken the energy of other light having a different color. Finally, the pixel structure 02 will emit light of a specific color, and light emitted from the pixel structure 02 has also higher brightness. In an embodiment of the present disclosure, the pixel structure 02 can emit, via the resonant cavity, light having the same color as the color resist block 031 corresponding to this pixel structure 02.

Optionally, the pixel structure 02 in the display substrate 0 can comprise a tandem type of OLED which consists of a plurality of electroluminescent structures for example. It should be noted that luminous efficiency and luminous power of the tandem type OLED are both relatively higher. Therefore, luminous efficiency and luminous power of the display substrate 0 provided in embodiments of the present disclosure are both relatively higher too.

Exemplarily, the display substrate provided by embodiments of the present disclosure can have various implementations, and five of them will be illustrated below by examples.

Figure 2:
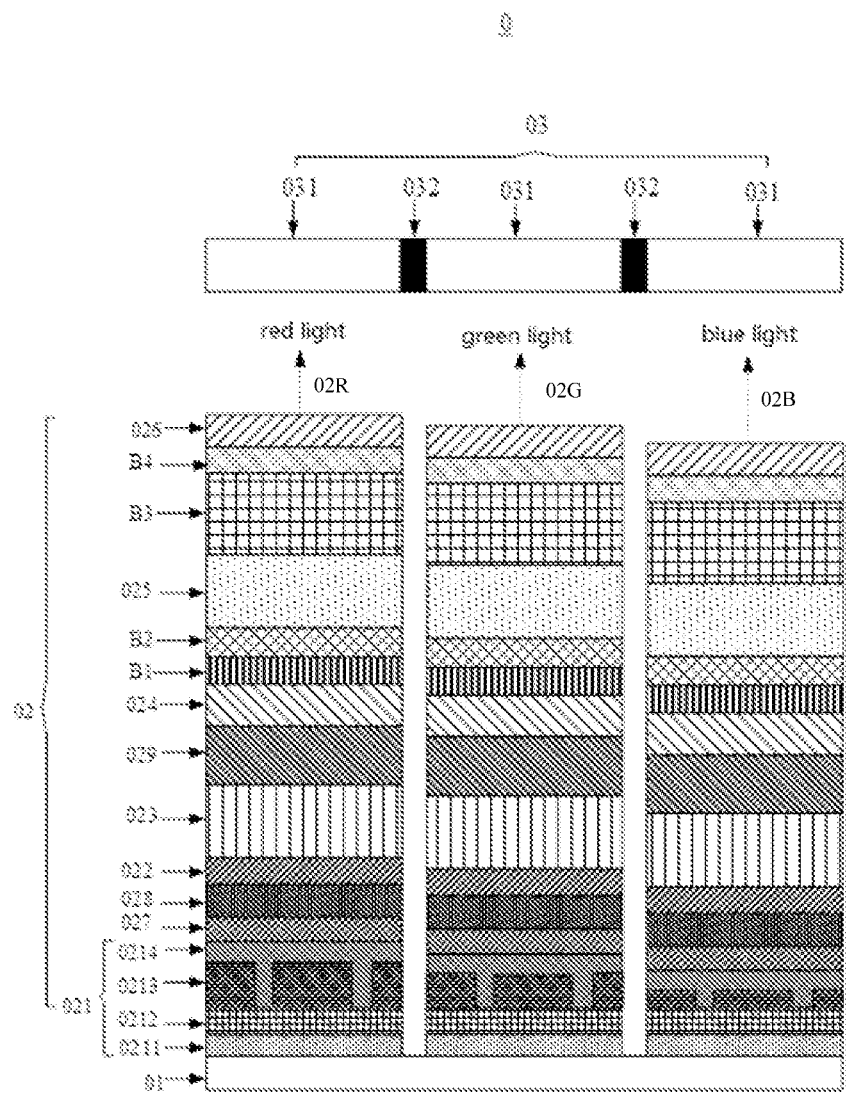
FIG. 2 is a schematic structure view of a display substrate according to an embodiment of the present disclosure.

FIG. 2 is a schematic structure view of a display substrate according to an embodiment of the present disclosure. Specifically, FIG. 2 shows an implementation of the display substrate. The pixel structure 02 in the display substrate 0 may comprise a first electrode 021, a red light emitting layer 022, a green light emitting layer 023, a first electrical connection layer 024, a blue light emitting layer 025 and a second electrode 026 arranged on the base plate 01 sequentially.

As an example, one of the first electrode 021 and the second electrode 026 can be a cathode, and the other can be an anode. In an embodiment of the present disclosure, for example, the first electrode 021 is an anode, and the second electrode 026 is a cathode. Exemplarily, a resonant cavity can be formed by the first electrode 021 and the second electrode 026 in the OLED. For each OLED, the cavity length d of the resonant cavity in the OLED is correlated with the wavelength $\lambda$ of light emitted from the OLED.

For example, the relationship between the cavity length d and the wavelength $\lambda$ can be expressed as $2k(\lambda/2)=2nd\cos\theta$, wherein k is a coefficient being positive integer and is generally called a cavity length coefficient; n is an average refractive index of a medium in the resonant cavity; and $\theta$ is a reflective angle of light emitted from the OLED on the reflective conducting layer. Moreover, since the wavelength of light is correlated with the color of light, the cavity length of the resonant cavity is correlated with the color of light emitted from the OLED. In this case, the color of light emitted from the OLED can be adjusted by changing the cavity length d of the resonant cavity. In the display substrate 0, the wavelength of light emitted from the pixel structure is positively correlated with the cavity length of the resonant cavity in the pixel structure. This means that resonant cavities in two pixel structures 02 emitting light of different colors will have different cavity lengths.

In an embodiment of the present disclosure, the cavity length d of the resonant cavity in the pixel structure 02 can be adjusted by changing the thickness of the insulating layer in the first electrode 021 of the pixel structure 02. In this case, the wavelength of light emitted from the pixel structure will be positively correlated with the thickness of the insulating layer in the pixel structure. As can be seen, according to an embodiment of the present disclosure, the color, i.e., the wavelength, especially the central wavelength, of light emitted from the pixel structure can be adjusted by selecting the cavity length of the resonant cavity. Those skilled in the art should understand that light emitted from the resonant cavity generally has a certain spectral width. So, in the above indicated equation 2k (λ/2)=2nd cos θ about the relationship between the cavity length of the resonant cavity and the emission wavelength, λ is the central wavelength or the dominant wavelength of the emitted light. Even if the emitted light contains stray light of other wavelengths in consideration of errors or limitations in terms of processing steps, such stray light can also be filtered out by means of the subsequent color resist blocks. This effectively ensures the purity of light emitted from each pixel of the entire display substrate. In this regard, explanations and illustrations will be given herein in more detail with reference to table 1 and table 2.

Exemplarily, the first electrode 021 may comprise a first transparent conducting layer 0211, a reflective conducting layer 0212, an insulating layer 0213 and a second transparent conducting layer 0214 arranged on the base plate 01 sequentially. Moreover, the second transparent conducting layer 0214 is electrically connected with the reflective conducting layer 0212 by means of a via hole (not shown in FIG. 2) in the insulating layer 0213. The first transparent conducting layer 0211 and the second transparent conducting layer 0214 can be both made of indium tin oxides. The reflective conducting layer 0212 can be made of silver. The insulating layer 0213 can be made of silicon dioxide. The transflective conducting layer in the second electrode 026 can comprise a transflective material obtained by magnesium-silver doping. The insulating layers 0213 in two pixel structures 02 emitting light of different colors have different thicknesses. This means that the resonant cavities in two pixel structures 02 emitting light of different colors have different cavity lengths.

Optionally, when choosing the cavity length of the resonant cavity in each pixel structure 02, the corresponding coefficient k can be selected as any positive integer. In this case, if the coefficient k is a specified value, a suitable cavity length of the resonant cavity can be chosen based on the wavelength of light emitted by the pixel structure actually required. In other words, in an embodiment of the present disclosure, on the premise that the pixel structure 02 has been determined to emit light of a certain color by the effect of resonant cavity, the cavity length of the resonant cavity in the pixel structure 02 can be a cavity length corresponding to a specified coefficient k. This means that when the cavity length of the resonant cavity in the pixel structure 02 is shorter and the thickness of each film in the pixel structure 02 is thinner, the value of the corresponding coefficient k can be appropriately increased so as to augment the required cavity length of the resonant cavity and the thickness of each film in the pixel structure 02. Thereby, the manufacture of pixel structure 02 is facilitated.

Exemplarily, as shown in FIG. 2, the plurality of pixel structure 02 in the display substrate can comprise a red light pixel structure 02R for emitting red light, a green light pixel structure 02G for emitting green light, and a blue light pixel structure 02B for emitting blue light. As an example, the coefficient k corresponding to the cavity length of the first resonant cavity in the red light pixel structure 02R can be i, the coefficient k corresponding to the cavity length of the second resonant cavity in the green light pixel structure 02G can be i too, and the coefficient k corresponding to the cavity length of the third resonant cavity in the blue light pixel structure 02B can also be i, wherein i≥1. In other words, in the three pixel structures, the coefficients k corresponding to the cavity lengths of the resonant cavities are all i. In this case, for example, the thickness of the insulating layer in the red light pixel structure 02R can be 145 nm, the thickness of the insulating layer in the green light pixel structure 02G can be 90 nm, and the thickness of the insulating layer in the blue light pixel structure 02B can be 45 nm.

With continued reference to FIG. 2, each pixel structure 02 may further comprise a first hole injection layer (HIL) 027, a first hole transport layer (HTL) 028, a first electron transport layer (ETL) 029, a second hole injection layer B1, a second hole transport layer B2, a second electron transport layer B3 and an electron injection layer (EIL) B4. Besides, a thin film encapsulation (TFE) layer (not shown in FIG. 2) is further arranged between the plurality of pixel structures 02 and the color resist layer 03, and the color resist layer 03 may further comprise a black matrix pattern 032 located between various color resist blocks 031.

As an example, the first transparent conducting layer 0211 may have a thickness of 80 Å, the reflective conducting layer 0212 may have a thickness of 1000 Å, the second transparent conducting layer 0214 may have a thickness of 80 Å, the first hole injection layer 027 may have a thickness of 100 Å, the first hole transport layer 028 may have a thickness of 150 Å, the red light emitting layer 022 may have a thickness of 100 Å, the green light emitting layer 023 may have a thickness of 300 Å, the first electron transport layer 029 may have a thickness of 200 Å, the first electrical connection layer 024 may have a thickness of 150 Å, the second hole injection layer B1 may have a thickness of 100 Å, the second hole transport layer B2 may have a thickness of 100 Å, the blue light emitting layer 025 may have a thickness of 250 Å, the second electron transport layer B3 may have a thickness of 300 Å, the electron injection layer B4 may have a thickness of 100 Å, and the second electrode 026 may have a thickness of 120 Å.

Furthermore, as shown in FIG. 2, in the display substrate 0, each pixel structure 02 can comprise a tandem type of OLED (also called a stacked OLED). With continued reference to FIG. 2, in each pixel structure 02, the red light emitting layer 022 is used for emitting red light, the green light emitting layer 023 is used for emitting green light, and the blue light emitting layer 025 is used for emitting blue light. The red light emitting layer 022 and the green light emitting layer 023 are stacked together to form an electroluminescent structure, while the blue light emitting layer 025 forms an independent electroluminescent structure. The two electroluminescent structures are electrically connected via a first electrical connection layer 024 between the green light emitting layer 023 and the blue light emitting layer 025, such that a series connection is achieved between the two electroluminescent structures. That is to say, the red light emitting layer and the green light emitting layer form a first electroluminescent structure, while the blue light emitting layer forms a second electroluminescent structure. Also, the first electroluminescent structure and the second electroluminescent structure are connected in series via the first electrical connection layer.

Figure 3:
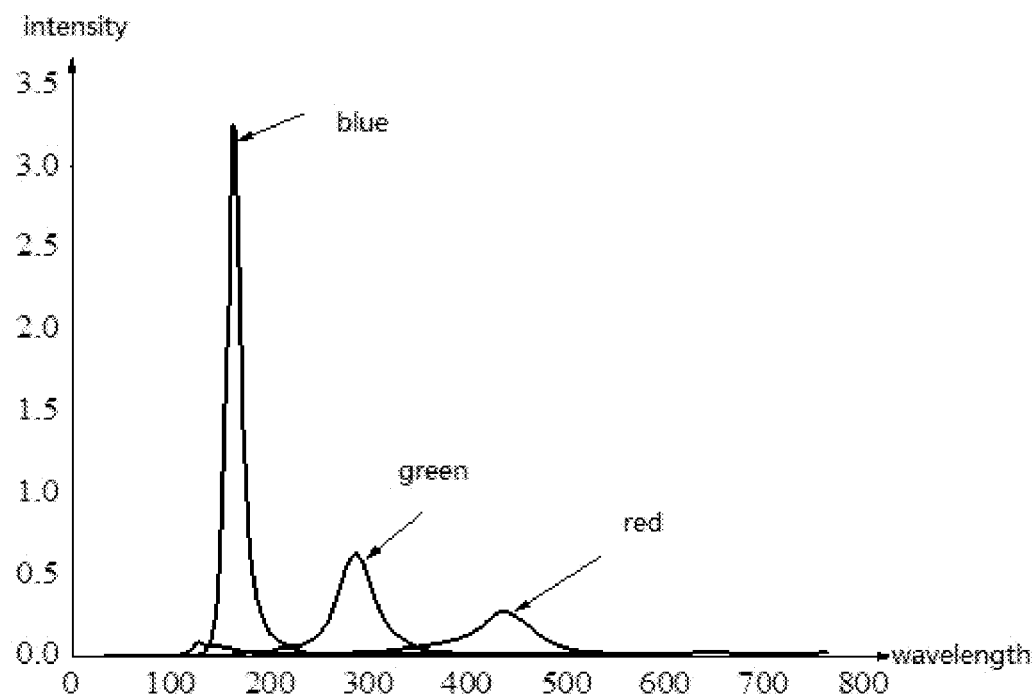
FIG. 3 is a graph showing the relationship between the intensity of light emitted from the display substrate of FIG. 2 and the wavelength thereof.

By simulating the display substrate provided by FIG. 2, a graph shown in FIG. 3 can be obtained. In the graph, the horizontal axis represents the wavelength of light in nanometer, and the vertical axis represents the intensity of light (dimensionless). With reference to FIG. 3, the wavelength of red light emitted from the display substrate is concentrated in the vicinity of 600 nm, the wavelength of green light is concentrated in the vicinity of 520 nm, and the wavelength of blue light is concentrated in the vicinity of 450 nm.

By simulating the display substrate provided by FIG. 2, parameters shown in Table 1 can also be obtained. Referring to Table 1 below, in the colorimetric standard formulated by the Commission Internationale de L'Eclairage (CIE), the reddest light emitted from the display substrate has the color coordinate CIEx (i.e., the color coordinate x in the gamut graph made by the CIE) of 0.650, CIEy (i.e., the color coordinate y in the gamut graph made by the CIE) of 0.341, and CIEY (i.e., the brightness according to the colorimetric standard formulated by the CIE) of 66.0; the greenest light emitted from the display substrate has the CIEx of 0.117, CIEy of 0.771, and CIEY of 79.6; while the bluest light emitted from the display substrate has the CIEx of 0.146, CIEy of 0.032, and CIEY of 66.8.

TABLE 1

| Color of light | CIEx | CIEy | CIEY |
| --- | --- | --- | --- |
| Red | 0.650 | 0.341 | 66.0 |
| Green | 0.117 | 0.771 | 79.6 |
| Blue | 0.146 | 0.032 | 66.8 |

Figure 4:
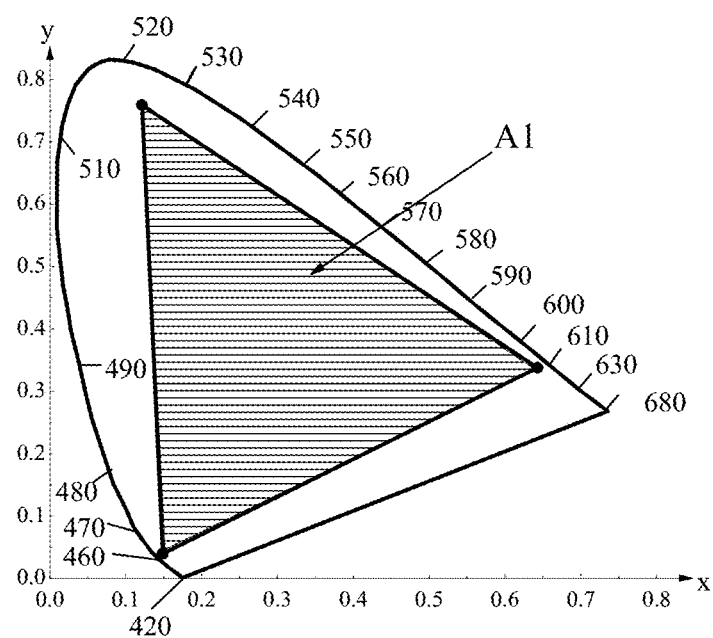
FIG. 4 is a gamut graph for light emitted from the display substrate of FIG. 2.

The gamut (e.g., gamut A1 in FIG. 4) of the display substrate in the gamut graph made by the CIE can be obtained from the color coordinates in Table 1. As can be seen, the display substrate provided by embodiments of the present disclosure can achieve a gamut of 120% in the gamut standard formulated by the National Television Standards Committee (NTSC).

Optionally, in embodiments of the present disclosure, the transmittance of color resist blocks can be 50%-60%, or higher than 60%, so as to improve the brightness of light emitted from the display substrate. However, embodiments of the present disclosure shall be never limited only to the above. Accordingly, the total brightness of all light emitted from the display substrate can reach 2500 nit. In contrast, in related arts, the transmittance of color resist blocks is often lower, and thus the total brightness of all light emitted from a conventional display substrate is lower, e.g., usually 300 nit.

As can be seen, the brightness, gamut and color purity of the display substrate provided according to embodiments of the present disclosure are all higher as compared with related arts. In this case, the display substrate can thus satisfy requirements for a display device in the micro-display field for instance.

Figure 5:
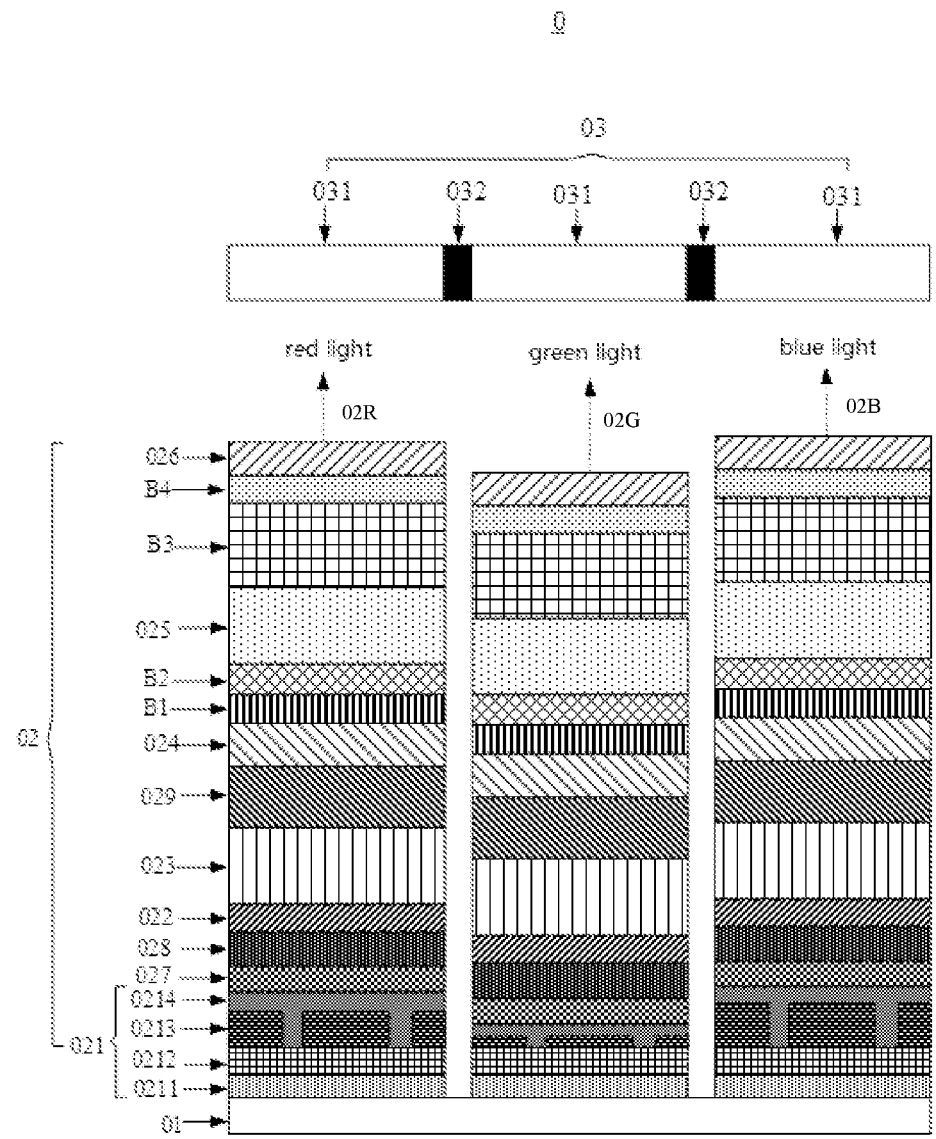
FIG. 5 is a schematic structure view of a display substrate according to an embodiment of the present disclosure.

FIG. 5 is a schematic structure view of a display substrate according to an embodiment of the present disclosure. FIG. 5 shows a second implementation of the display substrate.

In contrast with the display substrate shown by FIG. 2, now in the display substrate shown by FIG. 5, the coefficient k corresponding to the cavity length of the first resonant cavity in the red light pixel structure 02R can be j, the coefficient k corresponding to the cavity length of the second resonant cavity in the green light pixel structure 02G can also be j too, but the coefficient k corresponding to the cavity length of the third resonant cavity in the blue light pixel structure 02B can be j+1, wherein j≥1. Optionally, i and j can be either equal or not. As a specific example, the thickness of the insulating layer in the red light pixel structure 02R can be 90 nm, the thickness of the insulating layer in the green light pixel structure 02G can be 18 nm, and the thickness of the insulating layer in the blue light pixel structure 02B can be 120 nm.

Figure 6:
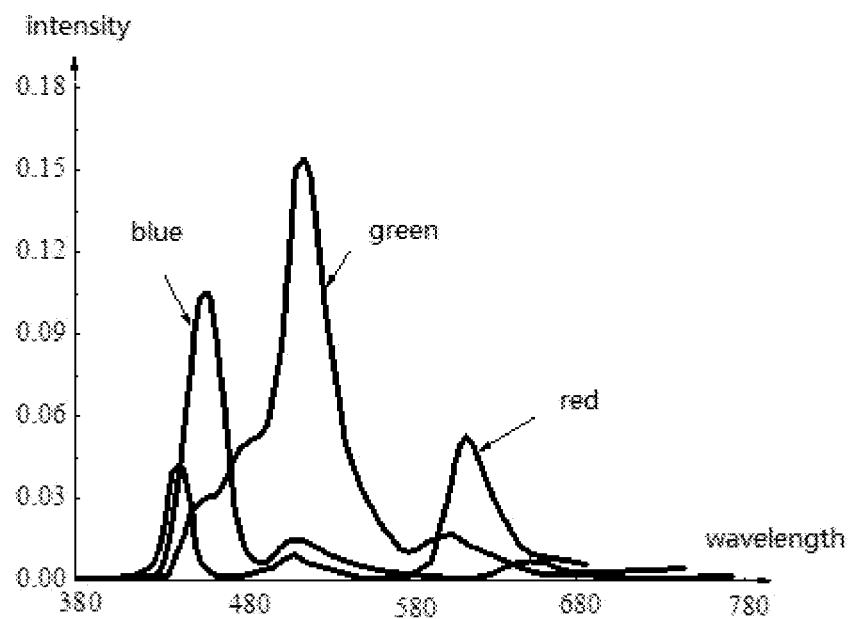
FIG. 6 is a graph showing the relationship between the intensity of light emitted from the display substrate of FIG. 5 and the wavelength thereof.

By simulating the display substrate provided by FIG. 5, a graph shown in FIG. 6 can be obtained. In the graph, the horizontal axis represents the wavelength of light in nanometer, and the vertical axis represents the intensity of light in $W \cdot m^{-2} \cdot nm^{-1} \cdot sr^{-1}$. With reference to FIG. 6, the wavelength of red light emitted from the display substrate is concentrated in the vicinity of 620 nm, the wavelength of green light is concentrated in the vicinity of 520 nm, and the wavelength of blue light is concentrated in the vicinity of 460 nm.

By simulating the display substrate provided by FIG. 5, parameters shown in Table 2 can also be obtained. Referring to Table 2 below, the reddest light emitted from the display substrate has the CIEx of 0.673, the CIEy of 0.341 and the CIEY of 67.3; the greenest light emitted from the display substrate has the CIEx of 0.157, the CIEy of 0.740 and the CIEY of 68.9; and the bluest light emitted from the display substrate has the CIEx of 0.142, the CIEy of 0.048 and the CIEY of 26.8.

TABLE 2

| Color of light | CIEx | CIEy | CIEY |
| --- | --- | --- | --- |
| Red | 0.673 | 0.341 | 67.3 |
| Green | 0.157 | 0.740 | 68.9 |
| Blue | 0.142 | 0.048 | 26.8 |

Figure 7:
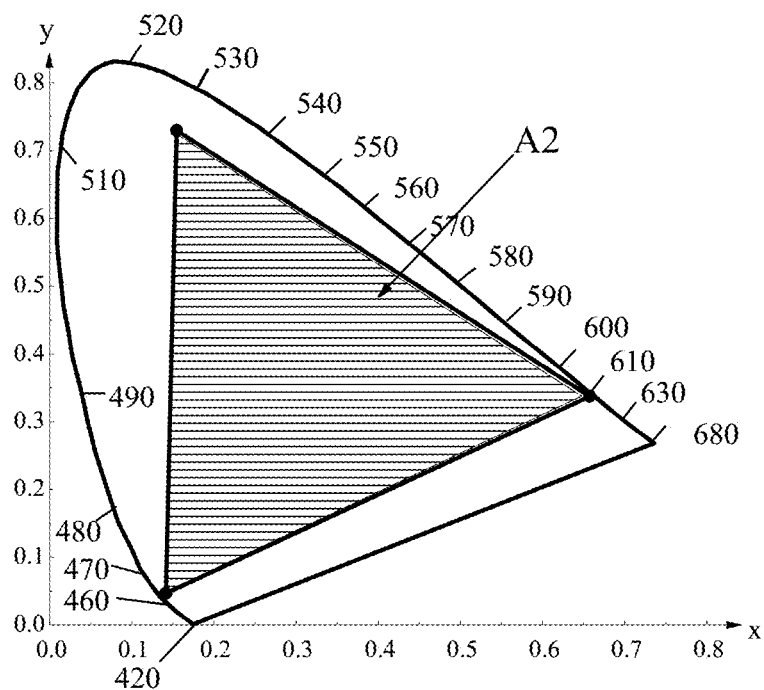
FIG. 7 is a gamut graph for light emitted from the display substrate of FIG. 5.

The gamut (e.g., gamut A2 in FIG. 7) of the display substrate in the gamut graph made by the CIE can be obtained from the color coordinates in Table 2. As can be seen, the display substrate provided according to embodiments of the present disclosure can achieve a gamut of 115% in the gamut standard formulated by the NTSC. In addition, the total brightness of all light emitted from the display substrate can reach 2200 nit.

Figure 8:
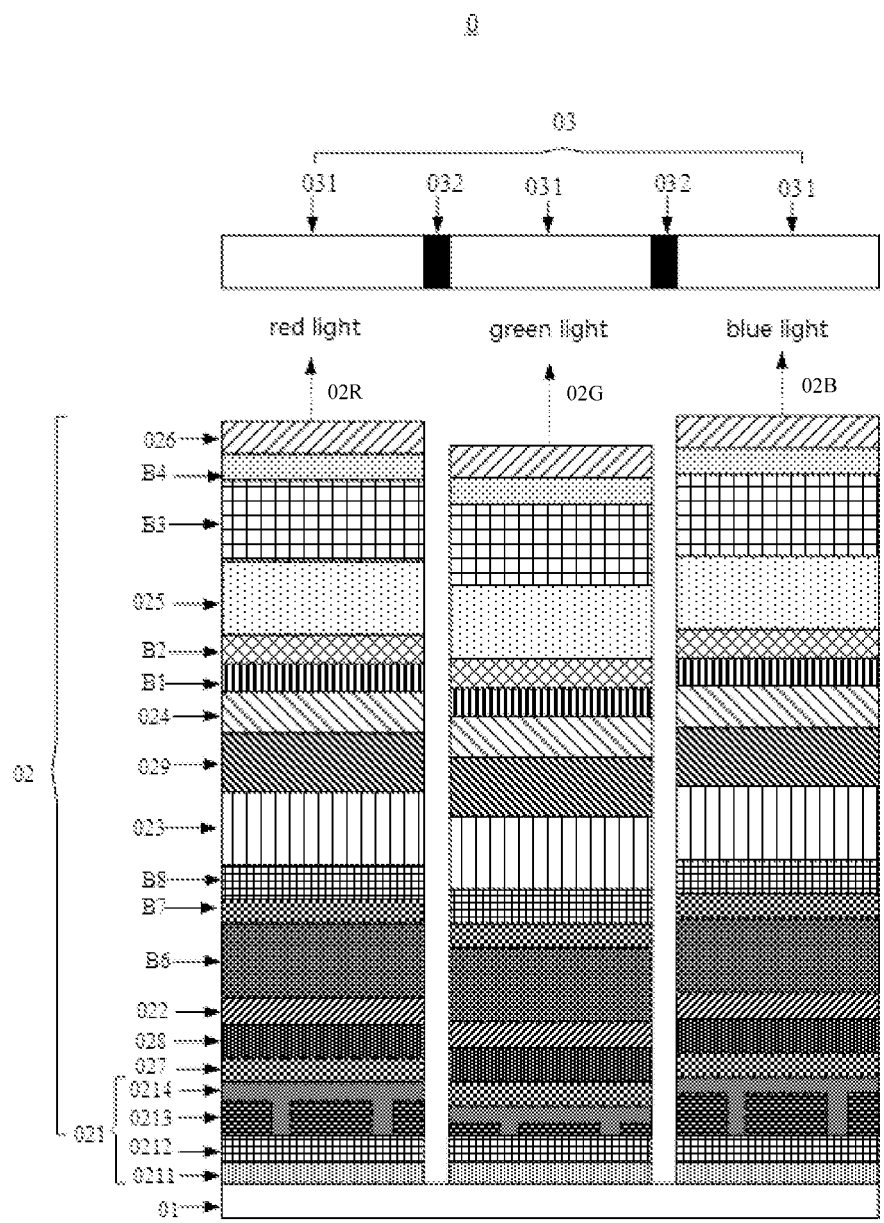
FIG. 8 is a schematic structure view of a display substrate according to an embodiment of the present disclosure.

FIG. 8 is a schematic structure view of a display substrate according to an embodiment of the present disclosure. FIG. 8 shows a third implementation of the display substrate.

In contrast with the display substrate shown by FIG. 5, in the display substrate shown by FIG. 8, the plurality of electroluminescent structures in each pixel structure 02 may also have different arrangements. Exemplarily, in each pixel structure 02 shown by FIG. 8, the red light emitting layer 022 forms an independent electroluminescent structure, the green light emitting layer 023 forms a further independent electroluminescent structure, and the blue light emitting layer 025 forms a still further independent electroluminescent structure. In this case, a second electrical connection layer B5 can be disposed between the red light emitting layer 022 and the green light emitting layer 023, such that the red light emitting layer 022 can be electrically connected with the green light emitting layer 023 via the second electrical connection layer B5. Besides, the green light emitting layer 023 can be electrically connected with the blue light emitting layer 025 via the first electrical connection layer 024. Therefore, the series connection between the three electroluminescent structures is finally achieved. That is to say, in the embodiment shown by FIG. 5, the red light emitting layer forms a first electroluminescent structure, the green light emitting layer forms a second electroluminescent structure, and the blue light emitting layer forms a third electroluminescent structure. Moreover, the first electroluminescent structure and the second electroluminescent structure are connected in series via the second electrical connection layer, while the second electroluminescent structure and the third electroluminescent structure are connected in series via the first electrical connection layer.

With continued reference to FIG. 8, the second electrical connection layer B5 may comprise a second electron transport layer B6, a third hole injection layer B7 and a third hole transport layer B8 stacked sequentially, wherein the electron transport layer is disposed close to the red light emitting layer 022. In an exemplary embodiment, the second electron transport layer B6 may have a thickness of 300 Å, the third hole injection layer B7 may have a thickness of 100 Å, and the third hole transport layer B8 may have a thickness of 150 Å.

The gamut of the display substrate in the gamut standard formulated by the NTSC, the total brightness of all light emitted from the display substrate, and the color purity of light emitted from the display substrate can be obtained by simulating the display substrate provided by FIG. 8. Apparently, in the third implementation, the gamut, the total brightness and the color purity of the display substrate are all higher as compared with related arts.

Figure 9:
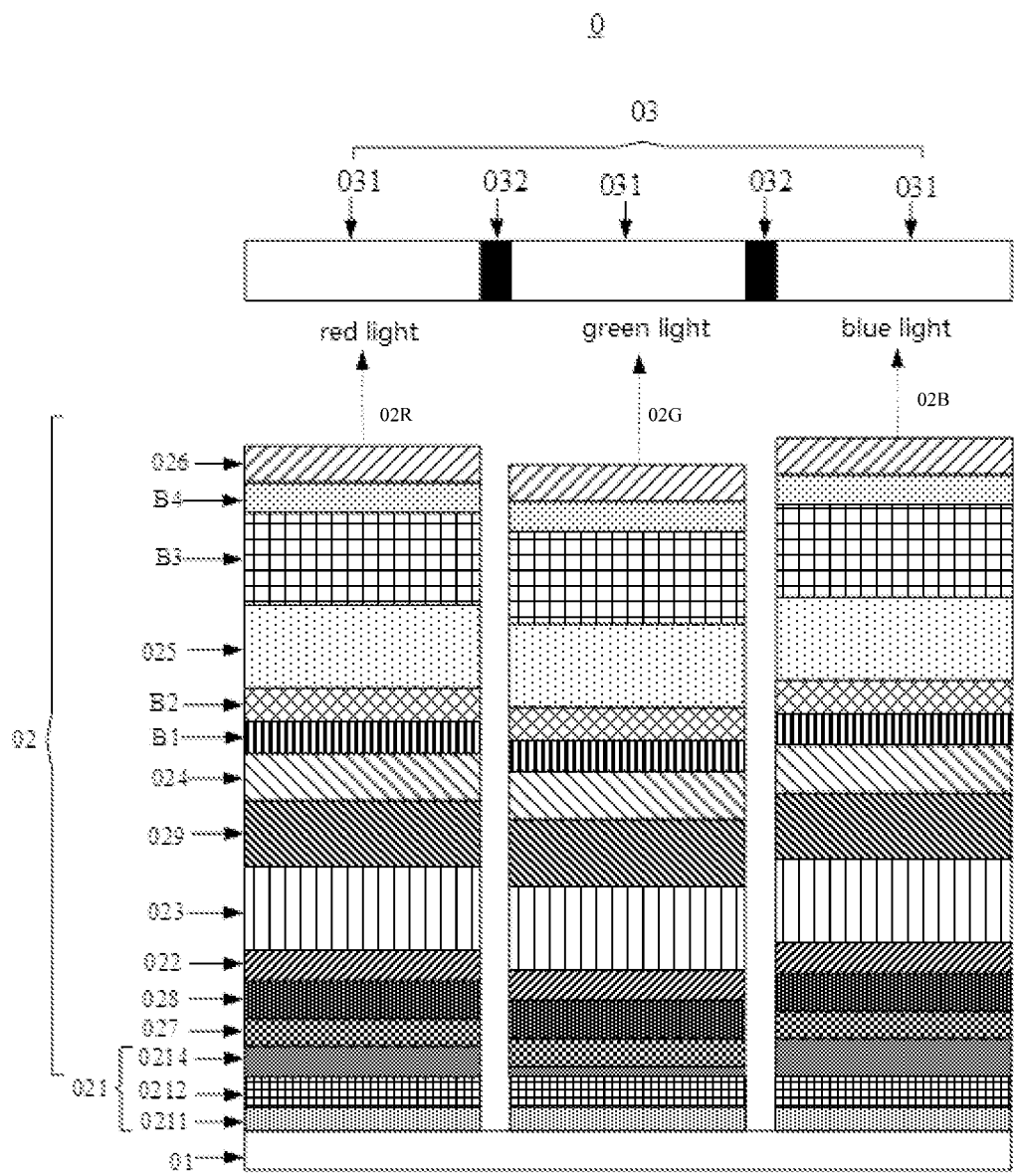
FIG. 9 is a schematic structure view of a display substrate according to an embodiment of the present disclosure.

FIG. 9 is a schematic structure view of a display substrate according to an embodiment of the present disclosure. FIG. 9 shows a fourth implementation of the display substrate.

In contrast with the display substrate shown by FIG. 2, in the display substrate shown by FIG. 9, the first electrode 021 in each pixel structure 02 may comprise no insulating layer, but only a first transparent conducting layer 0211, a reflective conducting layer 0212 and a second transparent conducting layer 0214 arranged on the base plate 01 sequentially. In this case, the cavity length d of the resonant cavity in the pixel structure 02 can be adjusted by changing the thickness of the second transparent conducting layer 0214 in the first electrode 021 of the pixel structure 02. Obviously, the second transparent conducting layers 0214 in two pixel structures 02 emitting light of different colors have different thicknesses. Specifically, the wavelength of light emitted from the pixel structure will be positively correlated with the thickness of the second transparent conducting layer in the pixel structure.

As an example, the thickness of the second transparent conducting layer in the red light pixel structure 02R can be 100 nm, the thickness of the second transparent conducting layer in the green light pixel structure 02G can be 26 nm, and the thickness of the second transparent conducting layer in the blue light pixel structure 02B can be 130 nm.

Figure 10:
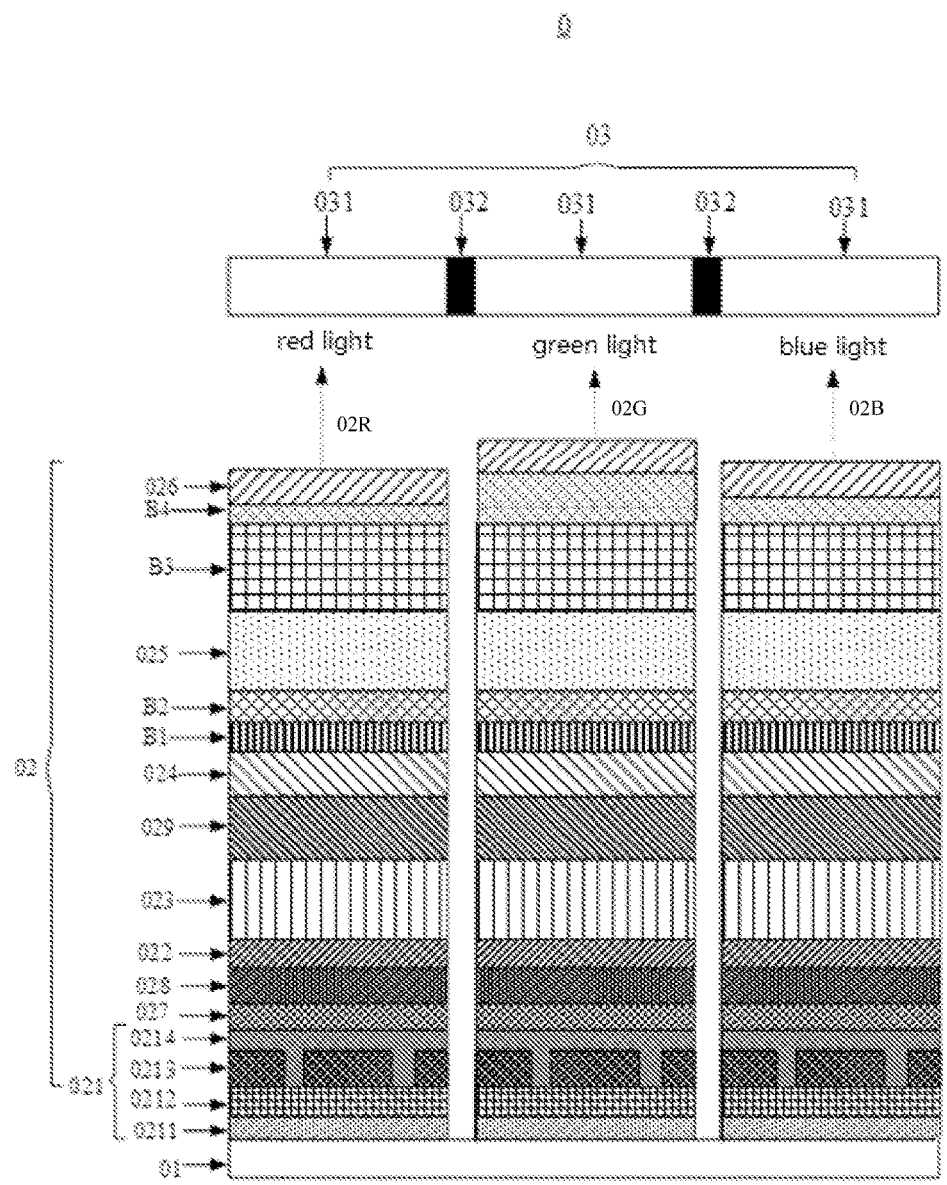
FIG. 10 is a schematic structure view of a display substrate according to an embodiment of the present disclosure.

FIG. 10 is a schematic structure view of a display substrate according to an embodiment of the present disclosure. FIG. 10 shows a fifth implementation of the display substrate.

In contrast with the display substrate shown by FIG. 2, in the display substrate shown by FIG. 10, the insulating layers 0213 in two pixel structures 02 emitting light of different colors may have the same thickness. Moreover, in the OLED, at least one of the electron injection layer B4, the electron transport layer (e.g., the first electron transport layer 029 and the second electron transport layer B3), the hole injection layer (e.g., the first hole injection layer 027 and the second hole injection layer B1), and the hole transport layer (e.g., the first hole transport layer 028 and the second hole transport layer B2) is a functional film. In this case, the functional films in two OLEDs emitting light of different colors may have different thicknesses. In an embodiment of the present disclosure, the functional film may be the electron injection layer B4 for example. Accordingly, for two OLEDs emitting light of different colors, the thicknesses of the electron injection layers B4 may be different. Optionally, the functional film may further comprise other films (e.g., the first hole injection layer 027), which is not particularly limited in embodiments of the present disclosure. Specifically, the cavity length d of the resonant cavity in the pixel structure 02 can be adjusted by changing the thickness of the functional film in the pixel structure 02.

The display substrate provided by embodiments of the present disclosure will be compared with the display substrate in the related arts for the purpose of analysis.

Exemplarily, there can be two types of OLED display substrates according to the related arts, wherein one type of OLED display substrates comprises a base plate, a plurality of OLEDs arranged on the base plate, and a color resist layer arranged on a side of the plurality of OLEDs away from the base plate. Specifically, such OLEDs can all emit white light, and the color resist layer comprises a plurality of color resist blocks corresponding to the plurality of OLEDs respectively.

However, in the related arts, light emitted from the OLEDs is white light, and light capable of passing through the color resist blocks among the white light is in the minority. For example, red light capable of passing through the red color resist block among the white light is minor, green light capable of passing through the green color resist block among the white light is minor, or blue light capable of passing through the blue color resist block among the white light is minor. In this case, the color of light emitted from the display substrate is generally lighter, and thus the color purity of light emitted from the display substrate is lower. On the contrary, in embodiments of the present disclosure, the color of light emitted from OLED is the same as the color of the color resist block corresponding thereto. In other words, light capable of passing through the color resist blocks among all the light emitted from the OLED is in the majority. Thus, the color of light emitted from the display substrate is darker, and the color purity of light emitted from the display substrate is higher.

Figure 11:
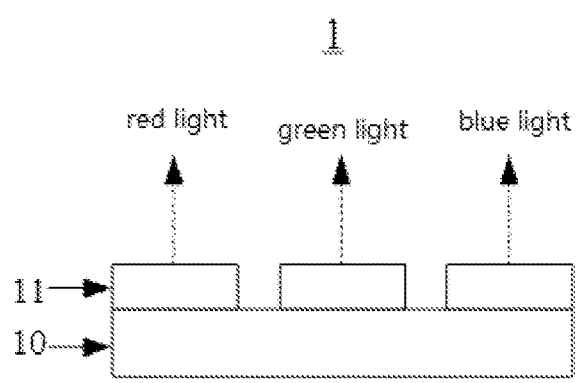
FIG. 11 is a schematic structure view of a display substrate according to related arts.

FIG. 11 is a schematic structure view of a further OLED display substrate according to the related arts. As shown in FIG. 11, the OLED display substrate 1 comprises a base plate 10 and a plurality of OLEDs 11 arranged on the base plate 10, wherein each OLED 11 can emit light of a specific color such that the plurality of OLEDs 11 can jointly emit red light, green light and blue light.

However, in the above approach, light emitted from each OLED 11 has a larger wavelength range, and it is usually mixed with light of other colors. For example, a certain OLED 11 is required to emit red light, but light emitted from this OLED 11 is usually mixed with some yellow light. In this way, the purity of light emitted from each OLED 11 will be lower. However, in embodiments of the present disclosure, a color resist block is arranged on a side of each OLED away from the base plate, and the color resist block can filter light emitted from the OLED. Thus, light components of other colors mixed in the light can be removed, helping to improve the purity of light emitted from the display substrate.

Furthermore, it should be noted that it is necessary to use a fine metal mask (FMM) for manufacture of the display substrate shown by FIG. 11. Thus, the manufacture is often restricted by the accuracy of FMM. For this reason, no OLED having a smaller orthogonal projection area on the base plate can be fabricated in the related arts, and thus the pixels per inch (PPI) of the display substrate is smaller.

Contrarily, it is unnecessary to use a FMM for manufacture of the display substrate provided in embodiments of the present disclosure, and thus the process for manufacturing a display substrate will not be restricted by FMM. As a result, the display substrate provided by embodiments of the present disclosure will have a greater PPI. Exemplarily, PPI of the display substrate in embodiments of the present disclosure can reach 6000. In contrast, PPI of the display substrate in the related arts is generally smaller than 6000, e.g., about 2000.

Besides, according to embodiments of the present disclosure, the display substrate can also achieve a gamut of greater than 100% in the gamut standard formulated by the NTSC.

It should be noted that in embodiments of the present disclosure, the layout sequence of each light emitting layer within the pixel structure is only shown or discussed exemplarily. Optionally, the layout sequence of each light emitting layer can also be modified, which is not limited in embodiments of the present disclosure.

To sum up, a display substrate is provided in embodiments of the present disclosure, comprising a plurality of pixel structures and a color resist layer, wherein each pixel structure is used for emitting light having the same color as the color resist block corresponding thereto. Therefore, among light emitted from all the pixel structures, light capable of passing through the color resist blocks will be in the majority, such that the display substrate is elevated in color purity and improved in display effect.

Figure 12:
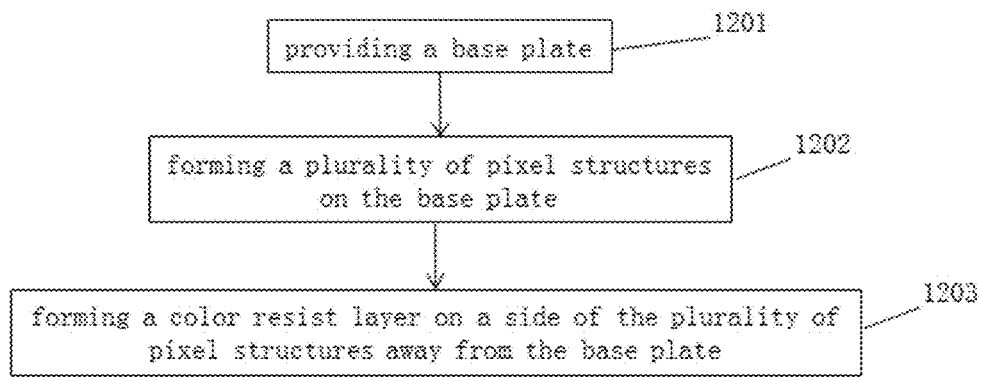
FIG. 12 is a flow chart of a manufacturing method for a display substrate according to an embodiment of the present disclosure.

FIG. 12 is a flow chart of a manufacturing method for a display substrate according to an embodiment of the present disclosure. The method can be used for manufacturing a display substrate as shown in any of FIG. 1, FIG. 2, FIG. 5, FIG. 8, FIG. 9 and FIG. 10. As shown in FIG. 12, the manufacturing method for a display substrate can comprise steps as follows.

Step 1201, providing a base plate.

Step 1202, forming a plurality of pixel structures on the base plate.

Step 1203, forming a color resist layer on a side of the plurality of pixel structures away from the base plate.

Specifically, the color resist layer comprises a plurality of color resist blocks corresponding to the plurality of pixel structures respectively, wherein each of the plurality of pixel structures emits light of a specific color, and the color of light emitted from each pixel structure is the same as the color of the color resist block corresponding thereto.

To sum up, according to embodiments of the present disclosure, a manufacturing method for a display substrate is provided. Specifically, the display substrate manufactured using this method comprises a plurality of pixel structures and a color resist layer, wherein each pixel structure is used for emitting light having the same color as the color resist block corresponding thereto. Therefore, among light emitted from all the pixel structures, light capable of passing through the color resist blocks is in the majority, such that the color purity of the display substrate is elevated and the display effect of the display substrate is improved.

It should be noted that in embodiments of the present disclosure, the display substrate manufactured by using the above method may have various implementations, e.g., those shown in FIG. 2, FIG. 5, FIG. 8, FIG. 9 and FIG. 10. The manufacturing methods for the display substrate are similar in these implementations. As an example, in an embodiment of the present disclosure, the above manufacturing method can be used for manufacturing the display substrate shown in FIG. 2.

Figure 13:
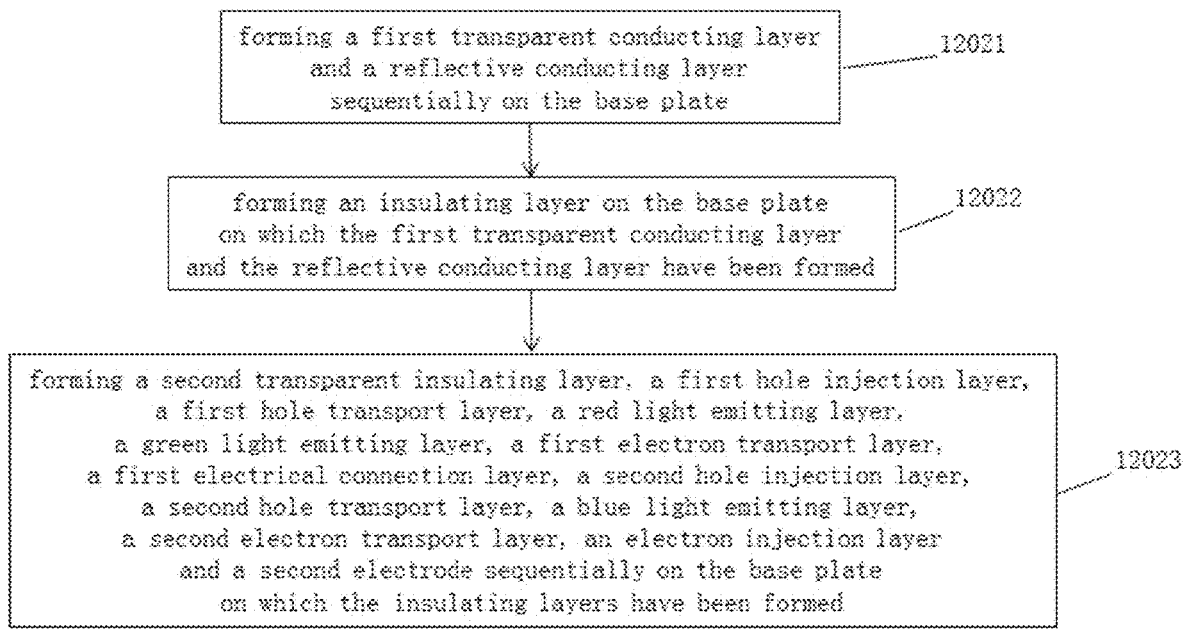
FIG. 13 is a flow chart of a manufacturing method for a display substrate according to an embodiment of the present disclosure.

Exemplarily, when manufacturing the display substrate of FIG. 2, step 1202 may comprise the following sub-steps as shown in FIG. 13.

Step 12021, forming a first transparent conducting layer and a reflective conducting layer sequentially on the base plate.

Figure 14:
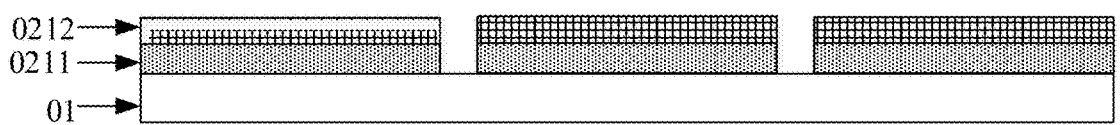
FIG. 14 is a schematic structure view of a display substrate during the manufacturing process according to an embodiment of the present disclosure.

Optionally, as shown in FIG. 14, when manufacturing the first transparent conducting layer 0211, a layer of transparent conducting material can be deposited on the base plate 01 by coating, magnetron sputtering, thermal evaporation, Plasma Enhanced Chemical Vapor Deposition (PECVD) or the like. Thus, a layer of transparent conducting material (not shown in FIG. 14) is obtained. After that, the layer of transparent conducting material is treated by a patterning process, thereby obtaining a first transparent conducting layer 0211.

As an example, the patterning process comprises photoresist coating, exposing, developing, etching and photoresist stripping. Therefore, the step of treating the transparent conducting material layer by a patterning process comprises sub-steps of: applying a layer of photoresist on the transparent conducting material layer; exposing the photoresist to light with a mask so as to form a fully exposed region and an unexposed region; performing a developing process to remove the photoresist in the fully exposed region and retain the photoresist in the unexposed region; and then etching the corresponding fully exposed region on the transparent conducting material layer and stripping the photoresist in the unexposed region after etching, thereby obtaining a first transparent conducting layer 0211.

After formation of the first transparent conducting layer 0211, a layer of reflective conducting material (not shown in FIG. 14) may be formed on the base plate 01 on which the first transparent conducting layer 0211 has been formed. After that, the layer of reflective conducting material is treated by a patterning process, thereby obtaining a reflective conducting layer 0212 as shown in FIG. 14.

Step 12022, forming an insulating layer on the base plate on which the first transparent conducting layer and the reflective conducting layer have been formed.

It should be noted that it is necessary to form on the base plate a plurality of pixel structures capable of emitting light of multiple colors. Besides, as shown in FIG. 2, in the display substrate, it is also necessary to change the thickness of the insulating layer so as to enable adjustment in the color of light emitted from the corresponding OLEDs. Therefore, in step 12022, it is necessary to form insulating layers with various thicknesses on the base plate. Exemplarily, it is necessary to form on the base plate OLEDs capable of emitting red light, capable of emitting green light, and capable of emitting blue light respectively. Therefore, in step 12022, it is necessary to form insulating layers with three thicknesses on the base plate. For example, the insulating layer in the OLED emitting red light has the greatest thickness, and the insulating layer in the OLED emitting blue light has the smallest thickness.

The process for forming insulating layers on the base plate can proceed as shown in FIG. 15 to FIG. 18. With reference to FIG. 15 to FIG. 18, when forming the insulating layers 0213, an insulating material layer and a photoresist layer (which are not shown in FIG. 15 to FIG. 18) can be formed sequentially on the base plate 01 on which the first transparent conducting layer 0211 and the reflective conducting layer 0212 have been formed.

Figure 15:
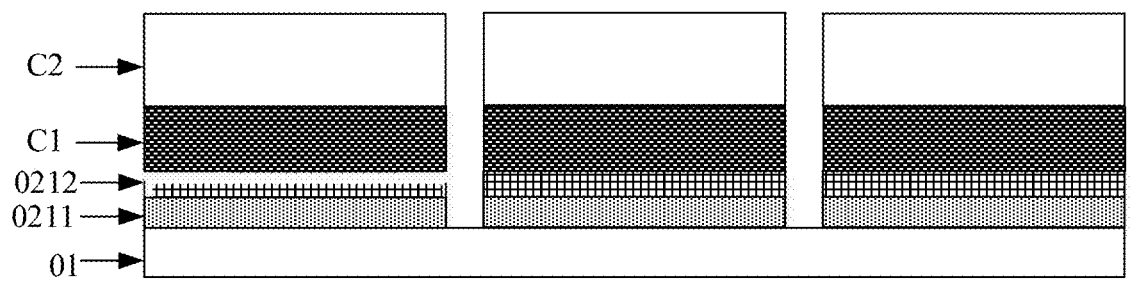
FIG. 15 is a schematic structure view of a display substrate during the manufacturing process according to an embodiment of the present disclosure.

Then, the photoresist layer is exposed to light with a mask so as to form a fully exposed region and an unexposed region, wherein the unexposed region is a region of the photoresist layer corresponding to the reflective conducting layer 0212. After that, a developing process is performed to remove the photoresist in the fully exposed region and retain the photoresist in the unexposed region. Then, a region of the insulating material layer corresponding to the fully exposed region is etched, and the photoresist in the unexposed region is stripped after etching. Thereby, a first insulating layer pattern C1 and a first photoresist pattern C2 as shown in FIG. 15 can be obtained.

Figure 16:
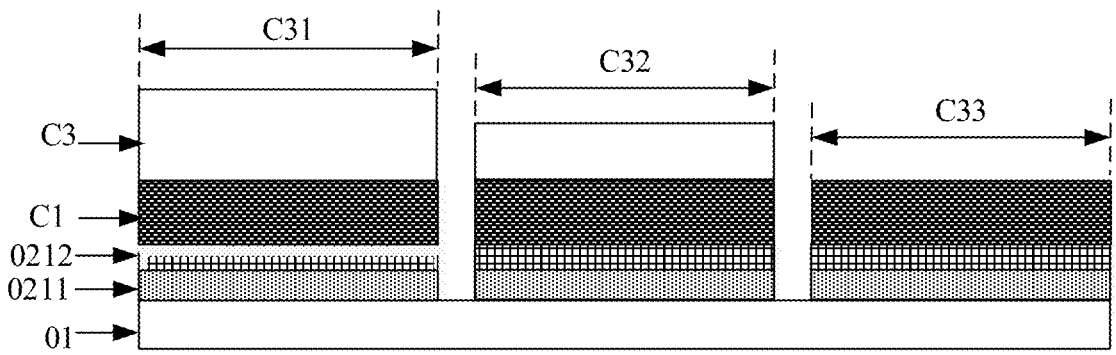
FIG. 16 is a schematic structure view of a display substrate during the manufacturing process according to an embodiment of the present disclosure.

Furthermore, after obtaining the first insulating layer pattern C1 and the first photoresist pattern C2, the first photoresist pattern C2 can be exposed and developed with a half tone mask, so as to remove the photoresist in a region where an insulating layer with the smallest thickness is to be formed, and to thin the photoresist in a region where an insulating layer with a smaller thickness is to be formed, thereby obtaining a second photoresist pattern C3 as shown in FIG. 16. The second photoresist pattern C3 comprises a first thickness region C31, a second thickness region C32 and a photoresist fully removed region C33, wherein the photoresist thickness of the first thickness region C31 is greater than that of the second thickness region C32, and the first thickness region C31 is a region of the second photoresist pattern C3 corresponding to the insulating layer with the greatest thickness to be formed.

Figure 17:
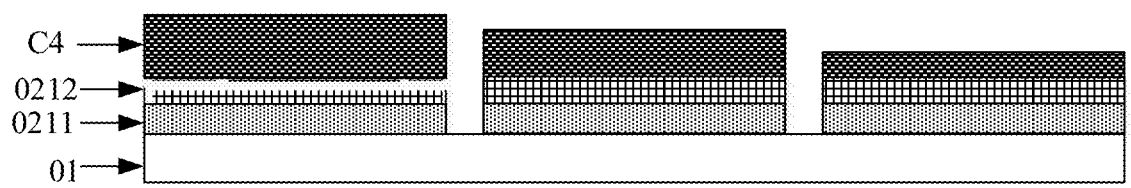
FIG. 17 is a schematic structure view of a display substrate during the manufacturing process according to an embodiment of the present disclosure.

After that, the first insulating layer pattern C1 may be etched, e.g., by dry etching using the second photoresist pattern C3 as a mask. During etching, the first insulating layer pattern C1 corresponding to the photoresist fully removed region C33 is thinned, while the second thickness region C32 and the first insulating pattern C1 corresponding thereto are both thinned. After that, the first thickness region C31 is stripped, thereby obtaining a second insulating layer pattern C4 as shown in FIG. 17.

Figure 18:
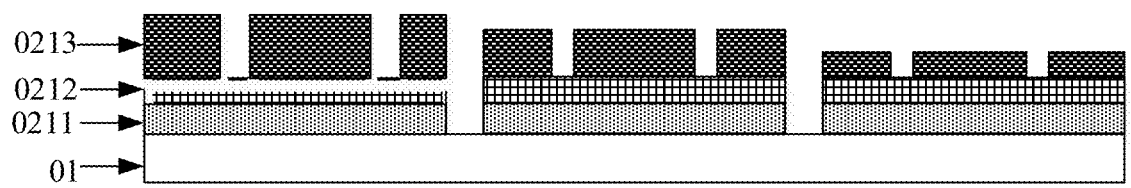
FIG. 18 is a schematic structure view of a display substrate during the manufacturing process according to an embodiment of the present disclosure.

Finally, as shown in FIG. 18, a via hole C5 may be formed in the second insulating layer pattern C4, and thereby insulating layers 0213 with three thicknesses are obtained. The insulating layers 0213 with three thicknesses correspond respectively to the first thickness region C31, the second thickness region C32 and the photoresist fully removed region C33 in the second photoresist pattern C3.

Optionally, step 12022 can also be implemented otherwise. For example, the insulating layers with three different thicknesses may be formed sequentially, which is not limited in embodiments of the present disclosure.

Step 12023, forming a second transparent insulating layer, a first hole injection layer, a first hole transport layer, a red light emitting layer, a green light emitting layer, a first electron transport layer, a first electrical connection layer, a second hole injection layer, a second hole transport layer, a blue light emitting layer, a second electron transport layer, an electron injection layer and a second electrode sequentially on the base plate on which the insulating layers have been formed.

In step 12023, the procedure needed for forming each film may comprise: applying a material suitable for the film and then treating the material by a patterning process. The procedure for forming the first transparent conducting layer or the reflective conducting layer in step 12021 may be referred to.

Figure 19:
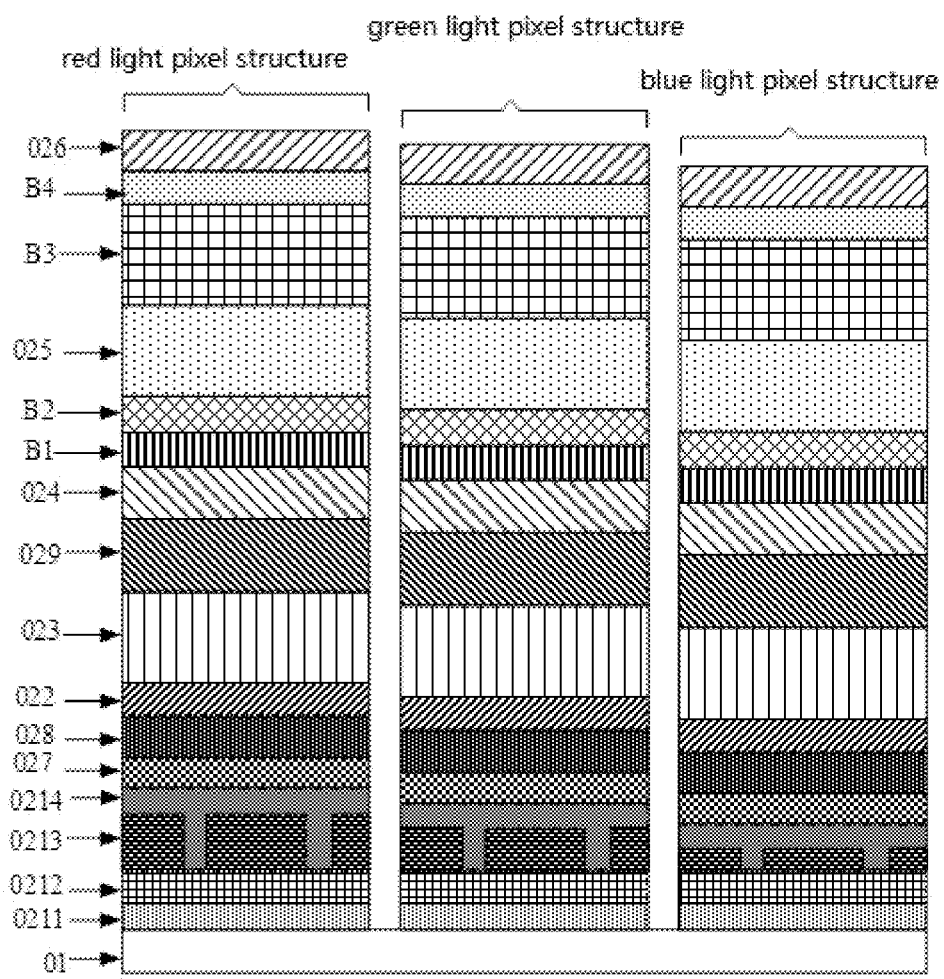
FIG. 19 is a schematic structure view of a display substrate during the manufacturing process according to an embodiment of the present disclosure.

After forming a second transparent insulating layer, a first hole injection layer, a first hole transport layer, a red light emitting layer, a green light emitting layer, a first electron transport layer, a first electrical connection layer, a second hole injection layer, a second hole transport layer, a blue light emitting layer, a second electron transport layer, an electron injection layer and a second electrode sequentially, a structure shown in FIG. 19 can be obtained. Exemplarily, the structure shown in FIG. 19 comprises a red light pixel structure capable of emitting red light, a green light pixel structure capable of emitting green light, and a blue light pixel structure capable of emitting blue light.

It should be noted that after fabricating a plurality of pixel structures, it is also necessary to form a TFE layer on the base plate on which the plurality of pixel structures have been formed. In step 1203, a color resist layer may be formed on the TFE layer.

To sum up, according to embodiments of the present disclosure, the display substrate manufactured by using the method provided above comprises a plurality of pixel structures and a color resist layer, wherein each pixel structure is used for emitting light having the same color as the color resist block corresponding thereto. Therefore, among light emitted from all the pixel structures, light capable of passing through the color resist blocks is in the majority, such that the color purity of the display substrate is higher and the display effect of the display substrate is better.

Embodiments of the present disclosure further provide a display device. The display device may comprise a display substrate as shown in any of FIG. 1, FIG. 2, FIG. 5, FIG. 8, FIG. 9 and FIG. 10. Exemplarily, the display device can be any product or component having a display function, such as electronic paper, a cellphone, a tablet computer, a television, a display, a notebook computer, a digital photo frame, a navigator and the like.

It should be noted that, for embodiments of the method provided in the present disclosure, embodiments of the corresponding display substrate and display device can be referred to, which is not particularly limited in embodiments of the present disclosure. Besides, in the method provided by embodiments of the present disclosure, the sequence of steps may be changed appropriately. Moreover, the steps can also be increased or decreased correspondingly as desired. Within the technical field of the present disclosure, any variation easily conceivable for a skilled person who is familiar with the technical field shall fall within the protection scope of the present disclosure, which will not be repeated for simplicity.

What is mentioned above is only optional embodiments of the present application and will not limit the present application. Any amendment, equivalent replacement and improvement made within the spirit and principle of the present application should fall within the protection scope of the present application.

The invention claimed is:

1. A display substrate, comprising:
   a base plate;
   a plurality of pixel structures on the base plate; and
   a color resist layer on a side of the plurality of pixel structures away from the base plate,
   wherein the color resist layer comprises a plurality of color resist blocks, each color resist block corresponding to one or more of the plurality of pixel structures, and
   wherein light emitted from each of the plurality of pixel structures has a same color as the color resist block corresponding thereto,
   wherein each pixel structure of the plurality of pixel structures comprises a plurality of electroluminescent structures connected in series,
   wherein each pixel structure of the plurality of pixel structures comprises a first light emitting layer, a second electrical connection layer, a second light emitting layer, a first electrical connection layer and a third light emitting layer arranged on the base plate sequentially, wherein the plurality of electroluminescent structures comprise a first electroluminescent structure, a second electroluminescent structure and a third electroluminescent structure, wherein the first electroluminescent structure comprises the first light emitting layer, the second electroluminescent structure comprises the second light emitting layer, the third electroluminescent structure comprises the third light emitting layer, wherein the first electroluminescent structure and the second electroluminescent structure are connected in series via the second electrical connection layer, and wherein the second electroluminescent structure and the third electroluminescent structure are connected in series via the first electrical connection layer.

2. The display substrate according to claim 1, wherein each color resist block corresponds to a respective pixel structure of the plurality of pixel structures.

3. A display device, comprising the display substrate according to claim 1.

4. The display device according to claim 3, wherein each pixel structure of the plurality of pixel structures comprises a plurality of electroluminescent structures connected in series.

5. The display device according to claim 3, wherein each color resist block corresponds to a respective pixel structure of the plurality of pixel structures.

6. A display substrate, comprising:
a base plate;
a plurality of pixel structures on the base plate; and
a color resist layer on a side of the plurality of pixel structures away from the base plate,
wherein the color resist layer comprises a plurality of color resist blocks, each color resist block corresponding to one or more of the plurality of pixel structures, and
wherein light emitted from each of the plurality of pixel structures has a same color as the color resist block corresponding thereto,
wherein each pixel structure of the plurality of pixel structures comprises a plurality of electroluminescent structures connected in series,
wherein each pixel structure of the plurality of pixel structures further comprises a first electrode and a second electrode,
wherein the first electrode, the plurality of electroluminescent structures and the second electrode are arranged on the base plate sequentially,
wherein the first electrode comprises a reflective conducting layer,
wherein the second electrode comprises a transflective conducting layer, and
wherein a distance between the reflective conducting layer and the transflective conducting layer is positively correlated with a wavelength of light emitted from the pixel structure,
wherein a distance d between the reflective conducting layer and the transflective conducting layer satisfies $$d = \frac{k\lambda}{2n\cos\theta},$$

wherein, coefficient k is a positive integer, $\lambda$ is a wavelength of light emitted from the pixel structure, n is an average refractive index of a medium between the reflective conducting layer and the transflective conducting layer, and $\theta$ is a reflective angle of light emitted from the pixel structure on the reflective conducting layer.

7. The display substrate according to claim 6,
wherein the first electrode further comprises a first transparent conducting layer, an insulating layer and a second transparent conducting layer,
wherein the first transparent conducting layer, the reflective conducting layer, the insulating layer and the second transparent conducting layer are arranged on the base plate sequentially,
wherein the second transparent conducting layer is electrically connected with the reflective conducting layer by a via hole in the insulating layer, and
wherein a wavelength of light emitted from the pixel structure is positively correlated with a thickness of the insulating layer in the first electrode.

8. The display substrate according to claim 6,
wherein the first electrode further comprises a first transparent conducting layer and a second transparent conducting layer,
wherein the first transparent conducting layer, the reflective conducting layer and the second transparent conducting layer are arranged on the base plate sequentially, and
wherein a wavelength of light emitted from the pixel structure is positively correlated with a thickness of the second transparent conducting layer in the first electrode.

9. The display substrate according to claim 6,
wherein each pixel structure of the plurality of pixel structures further comprises a functional film between the first electrode and the second electrode,
wherein the functional film comprises at least one of an electron injection layer, an electron transport layer, a hole injection layer or a hole transport layer, and
wherein a wavelength of light emitted from the pixel structure is positively correlated with a thickness of the functional film in the pixel structure.

10. The display substrate according to claim 6,
wherein the plurality of pixel structures comprises a first pixel structure for emitting a first color of light, a second pixel structure for emitting a second color of light, and a third pixel structure for emitting a third color of light, and
wherein the coefficient k is a same coefficient in the first pixel structure, the second pixel structure and the third pixel structure.

11. The display substrate according to claim 6,
wherein the plurality of pixel structures comprises a first pixel structure for emitting a first color of light, a second pixel structure for emitting a second color of light, and a third pixel structure for emitting a third color of light, and
wherein the coefficient k is a same coefficient in the first pixel structure and the second pixel structure, but is one less than the coefficient k in the third pixel structure.

12. A method for manufacturing a display substrate, comprising steps of:
providing a base plate;
forming a plurality of pixel structures on the base plate; and
forming a color resist layer on a side of the plurality of pixel structures away from the base plate, wherein the color resist layer comprises a plurality of color resist blocks, each color resist block corresponding to one or more of the plurality of pixel structures, and wherein light emitted from each of the plurality of pixel structures has a same color as the color resist block corresponding thereto, wherein the forming the plurality of pixel structures on the base plate comprises:

for each pixel structure of the plurality of pixel structures, forming a first electroluminescent structure, a second electrical connection layer, a second electroluminescent structure, a first electrical connection layer and a third electroluminescent structure sequentially on the base plate, wherein the first electroluminescent structure comprises a first light emitting layer, the second electroluminescent structure comprises a second light emitting layer, the third electroluminescent structure comprises a third light emitting layer, wherein the first electroluminescent structure and the second electroluminescent structure are connected in series via the second electrical connection layer, and wherein the second electroluminescent structure and the third electroluminescent structure are connected in series via the first electrical connection layer.

13. The method according to claim 12, wherein the first light emitting layer comprises a red light emitting layer, the second light emitting layer comprises a green light emitting layer, and the third light emitting layer comprises a blue light emitting layer.

\* \* \* \* \*